United States Patent [19]

Iwamatsu

[11] 4,043,024
[45] Aug. 23, 1977

[54] METHOD OF MANUFACTURING A SEMICONDUCTOR STORAGE DEVICE

[75] Inventor: Seiichi Iwamatsu, Tokyo, Japan
[73] Assignee: Hitachi, Ltd., Japan
[21] Appl. No.: 634,187
[22] Filed: Nov. 21, 1975
[30] Foreign Application Priority Data
 Nov. 22, 1974  Japan ............................ 49-133654
[51] Int. Cl.² ...................................... B01J 17/00
[52] U.S. Cl. ............................ 29/571; 29/578; 357/91
[58] Field of Search ................. 29/571, 578; 357/91
[56] References Cited
 U.S. PATENT DOCUMENTS

| 3,328,210 | 6/1967 | McCaldin | 357/91 |
| 3,413,531 | 11/1968 | Leith | 357/91 |
| 3,507,709 | 4/1970 | Bower | 357/91 |
| 3,852,120 | 12/1974 | Johnson | 357/91 |
| 3,873,373 | 3/1975 | Hill | 357/91 |

Primary Examiner—W. Tupman
Attorney, Agent, or Firm—Craig & Antonelli

[57] ABSTRACT

A method of manufacturing a semiconductor storage device comprises the steps of forming a source region and a drain region in a surface of a semiconductor substrate of a first conductivity type in a manner to be spaced from each other, said source and drain regions having a second conductivity type; forming an insulating film on said semiconductor substrate between said source and drain regions; implanting ions of an electrically conductive element into said insulating film, to thus form a floating gate; and leading out source and drain electrodes from said source and drain regions, respectively. By varying the implantation energy and the implantation dose rate in the implanting step, the amount of charges to be accumulated in the floating gate can be controlled.

2 Claims, 14 Drawing Figures

METHOD OF MANUFACTURING A SEMICONDUCTOR STORAGE DEVICE

FIELD OF THE INVENTION

This invention relates to a method of manufacturing a semiconductor storage device, and more particularly to a method of manufacturing insulated gate field-effect transistors of a nonvolatile semiconductor memory, etc.

DESCRIPTION OF THE PRIOR ART

Figure 1:
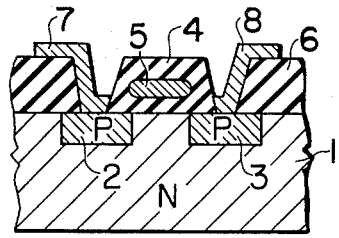
FIG. 1 is a sectional view of a prior-art semiconductor memory device of the FAMOS structure.

As an insulated gate field-effect transistor which is a principal part of a prior-art nonvolatile semiconductor memory, there has been known the FAMOS (floating gate avalanche injection metal oxide semiconductor) type structure as shown in FIG. 1. The figure illustrates an example of a P-channel device. Numeral 1 designates an N-type silicon substrate, numerals 2 and 3 P-type regions in which, for example, B (boron) is diffused and which serve as a source region and a drain region, respectively, numeral 4 a silicon oxide ($SiO_2$) film, numeral 5 a floating gate of silicon which is buried in the silicon oxide film 4, numeral 6 a thick silicon oxide film for leading out electrodes, and numerals 7 and 8 the aluminum electrodes of the source and drain, respectively.

In the operation of the semiconductor memory of the FAMOS type structure, electrons are accumulated in the floating gate by utilizing hot electron injection from the source and/or the drain.

In manufacturing the FAMOS type semiconductor memory, a method as illustrated in FIGS. 2a to 2g has been generally used.

Figure 2A:
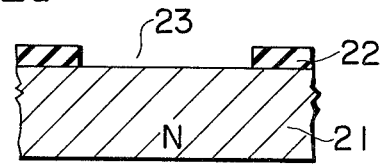
FIGS. 2a to 2g are sectional views which illustrate a prior-art method of manufacturing a semiconductor memory device in the order of steps.

By thermal oxidation in wet $O_2$, a silicon oxide film 22 having a thickness of about 1.4$\mu$ is formed on one principal surface of an N-type silicon substrate 21. The silicon oxide film 22 is subjected to a photoetching treatment, to form a window portion 23 in which the silicon substrate is exposed. (FIG. 2a).

Figure 2B:
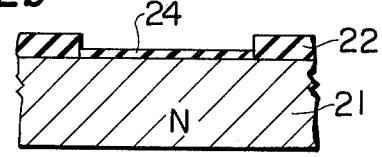

The silicon substrate 21 is subsequently heat-treated in dry $O_2$, to form a silicon oxide film 24 for a gate about 1,200 A thick. (FIG. 2b).

Figure 2C:
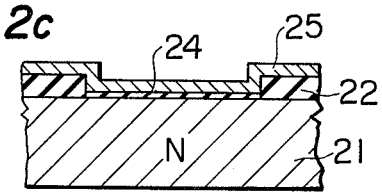

On the surfaces of the silicon oxide film 22 and the gate silicon oxide film 24 thus formed on the silicon substrate 21, a polycrystalline silicon layer 25 having a thickness of about 0.5$\mu$ is deposited by the CVD (chemical vapor deposition) process employing monosilane ($SiH_4$). (FIG. 2c).

Figure 2D:
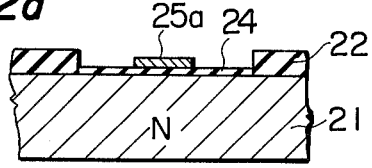

Subsequently, the polycrystalline silicon layer 25 is selectively photoetched to form a polycrystalline silicon layer 25a for a floating gate on the gate silicon oxide film 24. In this case, a mixed solution consisting of fluoric acid, nitric acid and glacial acetic acid is used as an etchant for the polycrystalline silicon layer 25. (FIG. 2d).

Figure 2E:
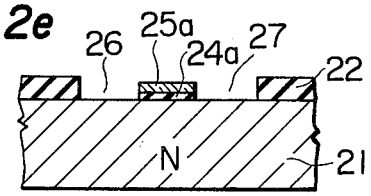

Further, the gate silicon oxide film 24 beneath the floating gate polycrystal silicon layer 25a is photoetched to form a gate silicon oxide film 24a which has the same size as the floating gate polycrystalline silicon layer 25a. In this case, a mixed solution consisting of fluoric acid and ammonium fluoride is used as an etchant for the gate silicon oxide film 24. Thus, window portions 26 and 27 are formed. (FIG. 2e).

Figure 2F:
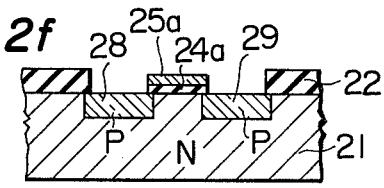

At the next step, a P-type source region 28 and a P-type drain region 29 are formed through respective window portions 26 and 27 by a deposition and extension diffusion process employing a boron impurity (FIG. 2f)

Figure 2G:
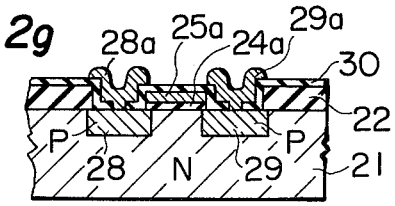

Thereafter, a silicon oxide film 30 is deposited on the entire principal surface of the resultant silicon substrate 21 by a (Chemical Vapor Deposition) CVD process. A source electrode 28a and a drain electrode 29a of aluminum are respectively formed for the P-type source region 28 and the P-type drain region 29, so that a FAMOS type semiconductor memory device is obtained. (FIG. 2g)

In accordance with the structure and the method of manufacture described above, the gate silicon oxide film 24a the floating gate polycrystalline silicon layer 25a and the silicon oxide film 30 covering the polycrystalline silicon layer are formed in separate steps. Moreover, the respective steps are attended with the photoetching steps. Therefore, the manufacturing process is complicated.

Furthermore, according to the above FAMOS type semiconductor memory device, the amount of charge to be accumulated in the floating gate polycrystal silicon layer is fixed.

SUMMARY OF THE INVENTION

It is, accordingly, an object of this invention to provide a method of manufacturing a semiconductor storage device which simplifies the manufacturing process.

Another object of this invention is to provide a method of manufacturing a semiconductor storage device which can control the amount of accumulation of charges.

The fundamental construction of this invention for accomplishing the object resides in a method of manufacturing a semiconductor storage device, comprising the step of forming a source region and a drain region in a surface of a semiconductor substrate of a first conductivity type in a manner to be spaced from each other, said source and drain regions having a second conductivity type, the step of forming an insulating film on said semiconductor substrate between said source and drain regions, the step of implanting ions of an electrically conductive element into said insulating film, thus to form a floating gate, and the step of leading out source and drain electrodes from said source and drain regions, respectively.

DETAILED DESCRIPTION OF THE INVENTION

Hereunder this invention will be described in detail in connection with a preferred embodiment.

Figure 3A:
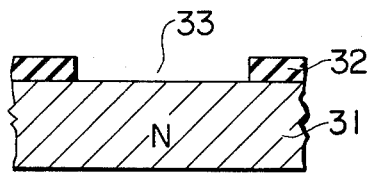
FIGS. 3a to 3f are sectional views which illustrate an embodiment of the method of manufacturing a semiconductor storage device according to this invention.

FIGS. 3a to 3f illustrate an embodiment of this invention, and are structural sections showing steps carried out in a method of manufacturing an insulated gate field-effect transistor. Referring to the figures, an N-type silicon substrate 31 is prepared, and a silicon oxide film 32 having a thickness of about 1.4$\mu$ is formed on one principal surface of the silicon substrate 31 by thermal oxidation in wet $O_2$. The silicon oxide film 32 is selectively photoetched to form a window portion 33 in which the silicon substrate is exposed. (FIG. 3a)

Figure 3B:
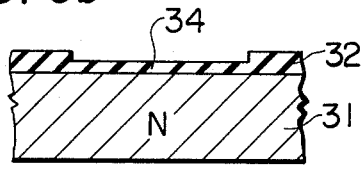

At the next step, the silicon substrate 31 is heat-treated in dry $O_2$ at a temperature of about 1,200° C, so that a silicon oxide film 34 for a gate as is 1,000 to 1,500A thick is formed on the surface of the window portion 33. (FIG. 3b)

Figure 3C:
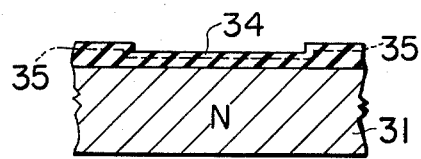

Into the silicon oxide film 32 as well as the gate silicon oxide film 34 formed on one principle surface of the silicon substrate 31, silicon (Si) is ion-implanted at an implantation energy of 30 to 70 KeV and in an implantation dose amount of about $1 \times 10^{14}$ to $1 \times 10^{16}$/cm². Thus, a silicon ion-implanted layer 35 is formed. In this case, the silicon ion-implanted layer 35 must be formed at least in the gate silicon oxide film 34. (FIG. 3c)

As a preferred embodiment of this invention, the thickness of the gate silicon oxide film 34 is 1,200A, the implantation energy is 50 keV, so that the peak value of the implantation distribution may lie substantially in the middle (600 A) of the thickness of the gate silicon oxide film 34, and the implantation dose amount is $1 \times 10^{16}$/cm², so that a concentration of $1 \times 10^{21}$/cm³ may be established at the peak of the implantation distribution.

Figure 3D:
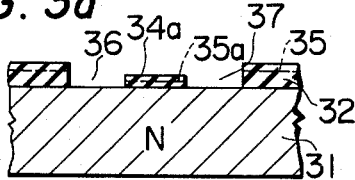

Subsequently, the gate silicon oxide film 34 is selectively photoetched, to form a gate insulating film 34a having an area and shape as predetermined and to form window portions 36 and 37. Within the gate insulating film 34a, there is formed a silicon ion-implanted layer 35a, which acts as a floating gate having hitherto been known. (FIG. 3d)

Figure 3E:
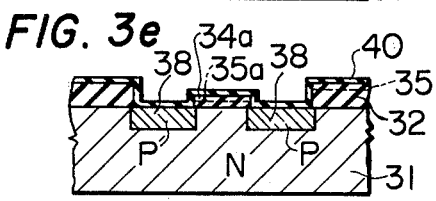

The resultant substrate is doped with a P-type impurity, for example, boron through the window portions 36 and 37 by the diffusion process, to form a P-type source region 38 and a P-type drain region 39 which have a surface impurity concentration of $1 \times 10^{20}$/cm² to $1 \times 10^{21}$/cm². During this diffusion step, a thermal oxidation ($SiO_2$) film 40 is formed on the silicon substrate. (FIG. 3e).

Figure 3F:
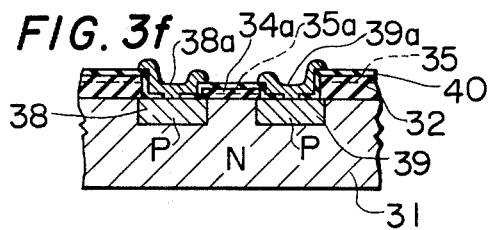

Subsequently, the thermal oxidation film 40 on the P-type source region 38 and the P-type drain region 39 is selectively photoetched, and a source electrode 38a and a drain electrode 39a of aluminum are formed to obtain the insulated gate field-effect transistor. (FIG. 3f).

Since, according to the above embodiment, the silicon ion-implanted layer 35 (floating gate) is previously formed in the gate silicon oxide film 34, a single photoetching step suffices for the formation of the gate portion as illustrated in FIG. 2d. The prior art has required the two steps for etching the gate silicon oxide film and the polycrystalline silicon layer (refer to FIGS. 2d and 2e.).

In the prior art, a silicon oxide film for protecting the surface of the polycrystalline silicon gate has been formed by the CVD process after the formation of the gate. According to this invention, it is unnecessary to especially form the silicon oxide film.

Furthermore, by varying the implanation energy and the implantation dose rate of the silicon ions in the case of forming the silicon ion-implanted layer to become the floating gate, the amount of charges to be accumulated in the silicon oxide film can be controlled, and the memory life can be selected.

Also, when the ions are implanted so that the peak value of the implantation distribution may be situated substantially in the middle of the thickness of the silicon oxide film, dispersion of the amounts of charges to be accumulated in the oxide films becomes small, and the semiconductor memory devices which accumulate uniform amounts of charge can be produced.

In the insulated gate field-effect transistor of the P-channel type as shown in FIGS. 3a to 3f, the silicon ion-implanted layer 35a formed in the silicon oxide film 34a serves as a trap center for the charges. in the case of injecting the charges, the source and drain junctions are brought into avalanche breakdown, and hot electrons accumulate in the trap center. The surfaces of the silicon substrate is inverted by space charges formed by the electrons accumulated at this time, and the conductance between the source and drain is changed. By utilizing this fact, binary states 1's and 0, are stored. The erasure after writing, namely, the erasure of the hot electrons is executed with X-rays or the like. In the case of an insulated gate field-effect transistor of the N-channel type, holes are accumulated instead of electrons.

Although, in the embodiment of this invention, the implanted layer of the silicon ions to become the trap center is formed in the silicon oxide film 34, an electrically conductive element, such as A1, Mo, and W, may be ion-implanted in place of the silicon element. The ion implantation conditions of these elements are as given in the following table:

TABLE

| Kinds of Ions | Implantation Energy | Implantation Dose Rate |
|---|---|---|
| Al | 30 – 70 keV | $1 \times 10^{14} - 1 \times 10^{16}$/cm² |
| Mo | 150 – 250 keV | $1 \times 10^{14} - 1 \times 10^{16}$/cm² |
| W | 300 – 500 keV | $1 \times 10^{14} - 1 \times 10^{16}$/cm² |

In particular, when the gate silicon oxide film is 1,200 A thick, the optimum conditions of the ion implantations of these elements are 50 keV and $1 \times 10^{16}$/cm² for Al, 200 keV and $1 \times 10^{16}$/cm² for Mo, and 400 keV and $1 \times 10^{16}$/cm² for W. In the case of forming the source and drain regions 38 and 39, ion implantation of impurity atoms can be used in place of the diffusion process. Further, the silicon ion implanting step may be carried out after the final step of forming the electrodes.

As explained above, the manufacturing process can be shortened by the use of the method of manufacturing a semiconductor storage device according to this invention. By selecting the ion implantation conditions, the amount of accumulation of charges can be controlled, and a desired memory life can be acquired.

I claim:

1. A method of manufacturing a semiconductor storage device comprising the steps of
   a. forming an oxide film on a surface of a semiconductor substrate of a first conductivity type;
   b. selectively removing said oxide film and thus exposing part of said surface of said semiconductor substrate;
   c. forming a gate oxide film thinner than the first-mentioned oxide film on the exposed part of said surface of said semiconductor substrate;
   d. implanting ions of an electrically conductive element into at least said gate oxide film, thus forming a floating gate;
   e. selectively removing part of the resultant gate oxide film thus forming therein window portions for forming source and drain regions spaced apart from each other;
   f. doping said semiconductor substrate with an impurity of a second conductivity type opposite said first conductivity type through said window portions for forming source and drain regions, thus forming said source and drain regions;

g. forming a chemical vapor deposition oxide film so as to cover said gate oxide film; and h. leading out source and drain electrodes from said source and drain regions, respectively.

2. The method of manufacturing a semiconductor storage device according to claim 1, wherein the ions of the silicon element are implanted so that the peak value of implantation distribution lies in the middle of the thickness of said gate oxide film.

* * * * *